(12) United States Patent  
Xia et al.

(10) Patent No.: US 12,089,392 B2  
(45) Date of Patent: Sep. 10, 2024

(54) METHOD FOR MANUFACTURING SEMICONDUCTOR STRUCTURE

(71) Applicant: CHANGXIN MEMORY TECHNOLOGIES, INC., Hefei (CN)

(72) Inventors: Jun Xia, Hefei (CN); Qiang Wan, Hefei (CN); Penghui Xu, Hefei (CN); Tao Liu, Hefei (CN); Sen Li, Hefei (CN); Kangshu Zhan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 463 days.

(21) Appl. No.: 17/457,273

(22) Filed: Dec. 2, 2021

(65) Prior Publication Data

US 2022/0246616 A1    Aug. 4, 2022

Related U.S. Application Data

(63) Continuation of application No. PCT/CN2021/109285, filed on Jul. 29, 2021.

(30) Foreign Application Priority Data

Jan. 29, 2021 (CN) .......................... 202110126271.1

(51) Int. Cl.
*H01L 27/108* (2006.01)
*G11C 5/10* (2006.01)
(Continued)

(52) U.S. Cl.
CPC ............... *H10B 12/03* (2023.02); *G11C 5/10* (2013.01); *H01L 27/0688* (2013.01); *H10B 12/30* (2023.02)

(58) Field of Classification Search
None
See application file for complete search history.

(56) References Cited

U.S. PATENT DOCUMENTS 6,716,756 B2    4/2004 Kang
2002/0045337 A1    4/2002 Nam et al.
(Continued)

FOREIGN PATENT DOCUMENTS

CN    1983553 A    6/2007
CN    108717936 A    10/2018
(Continued)

OTHER PUBLICATIONS

International Search Report as cited in PCT Application No. PCT/CN2021/109285 mailed Sep. 29, 2021, 4 pages.

*Primary Examiner* — Asok K Sarkar
(74) *Attorney, Agent, or Firm* — Syncoda LLC; Feng Ma

(57) ABSTRACT

An embodiment of the disclosure provides a method for manufacturing a semiconductor structure, including: providing a substrate, where the substrate has a peripheral region and an array region; stacking and forming an insulating layer and a mask layer with a mask pattern on the substrate; etching the insulating layer with the mask layer as a mask to form a contact hole penetrating the insulating layer at the array region; reserving the mask layer; in a direction perpendicular to a surface of the substrate, providing a thickness difference between the mask layer of the peripheral region and the mask layer of the array region; forming a first material layer; forming a second material layer; etching a part of the mask layer with the second material layer as the mask; and removing the remaining second material layer, the remaining mask layer and the first material layer on the remaining mask layer.

14 Claims, 14 Drawing Sheets

(51) Int. Cl.
*H01L 27/00* (2006.01)
*H01L 27/06* (2006.01)
*H10B 12/00* (2023.01)

(56) References Cited

U.S. PATENT DOCUMENTS

2007/0045666 A1    3/2007   Cho
2020/0098763 A1*   3/2020   Bae ................... H01L 21/0337

FOREIGN PATENT DOCUMENTS

| | | |
|---|---|---|
| CN | 110943085 A | 3/2020 |
| CN | 111740012 A | 10/2020 |
| CN | 111952167 A | 11/2020 |
| CN | 111987103 A | 11/2020 |

* cited by examiner

METHOD FOR MANUFACTURING SEMICONDUCTOR STRUCTURE

CROSS-REFERENCE TO RELATED APPLICATIONS

This application is a continuation application of International Patent Application No. PCT/CN2021/109285, filed on Jul. 29, 2021, which claims priority to Chinese Patent Application No. 202110126271.1, filed with the Chinese Patent Office on Jan. 29, 2021 and entitled "METHOD FOR MANUFACTURING SEMICONDUCTOR STRUCTURE". International Patent Application No. PCT/CN2021/109285 and Chinese Patent Application No. 202110126271.1 are incorporated herein by reference in their entireties.

TECHNICAL FIELD

The present application relates to the field of semiconductors, and in particular, to a method for manufacturing a semiconductor structure.

BACKGROUND

A memory in a semiconductor structure is a memory component configured to store programs and various data information. According to its usage type, the memory can be divided into a read-only memory and a random access memory. The memory usually includes a capacitor and a transistor connected to the capacitor. The capacitor is configured to store charges representing stored information. The transistor is configured as a switch that controls inflow and release of the charges in the capacitor.

With the continuous shrinking of process nodes of the memory, a distance between the adjacent capacitors gradually shortens. In order to avoid a problem of signal interference between the adjacent capacitors, higher requirements are put forward on dimensional accuracy of the capacitor and the semiconductor structure.

SUMMARY

An embodiment of the disclosure provides a method for manufacturing a semiconductor structure, including: providing a substrate, where the substrate has a peripheral region and an array region; stacking and forming an insulating layer and a mask layer with a mask pattern on the substrate; etching the insulating layer with the mask layer as a mask to form a contact hole penetrating the insulating layer at the array region; after the contact hole is formed, reserving the mask layer; in a direction perpendicular to a surface of the substrate, providing a thickness difference between the mask layer of the peripheral region and the mask layer of the array region; forming a first material layer, where a surface of the mask layer and a surface of the contact hole of the array region are at least covered with the first material layer; forming a second material layer, where the second material layer is located on the first material layer; etching a part of the mask layer with the second material layer as the mask to reduce a thickness difference between the mask layer of the peripheral region and the mask layer of the array region; and removing the remaining second material layer, the remaining mask layer and the first material layer on the remaining mask layer.

BRIEF DESCRIPTION OF DRAWINGS

One or more embodiments are illustrated by pictures in corresponding drawings, and unless otherwise stated, diagrams in the drawings do not constitute a scale limitation.

DESCRIPTION OF EMBODIMENTS

It can be known from the technical background that dimensional accuracy of a semiconductor structure in a prior art needs to be improved, and a yield of the semiconductor structure needs to be improved.

FIGS. 1 to 5 are schematic diagrams of cross-sectional structures corresponding to steps of a method for manufacturing a semiconductor structure.

Figure 1:
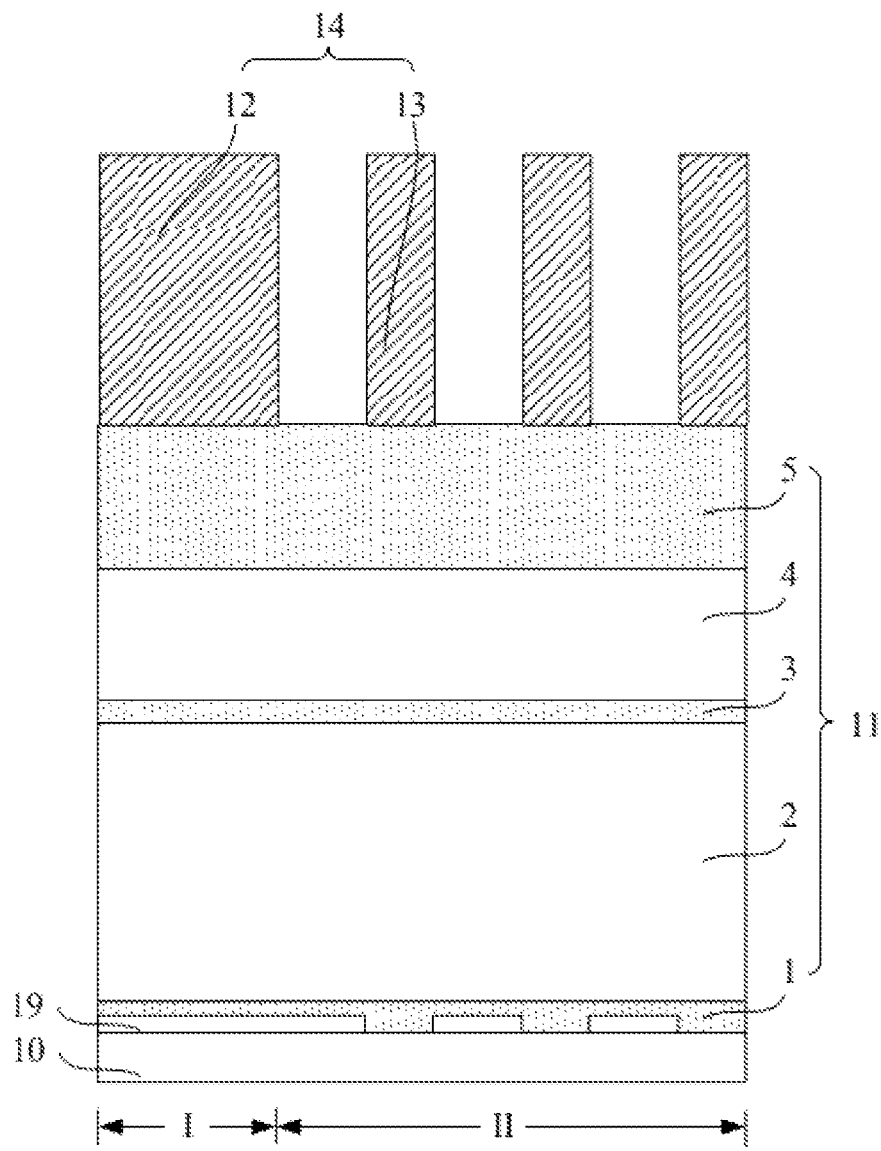
FIGS. 1 to 5 are schematic diagrams of cross-sectional structures corresponding to steps of a method for manufacturing a semiconductor structure.
Figure 2:
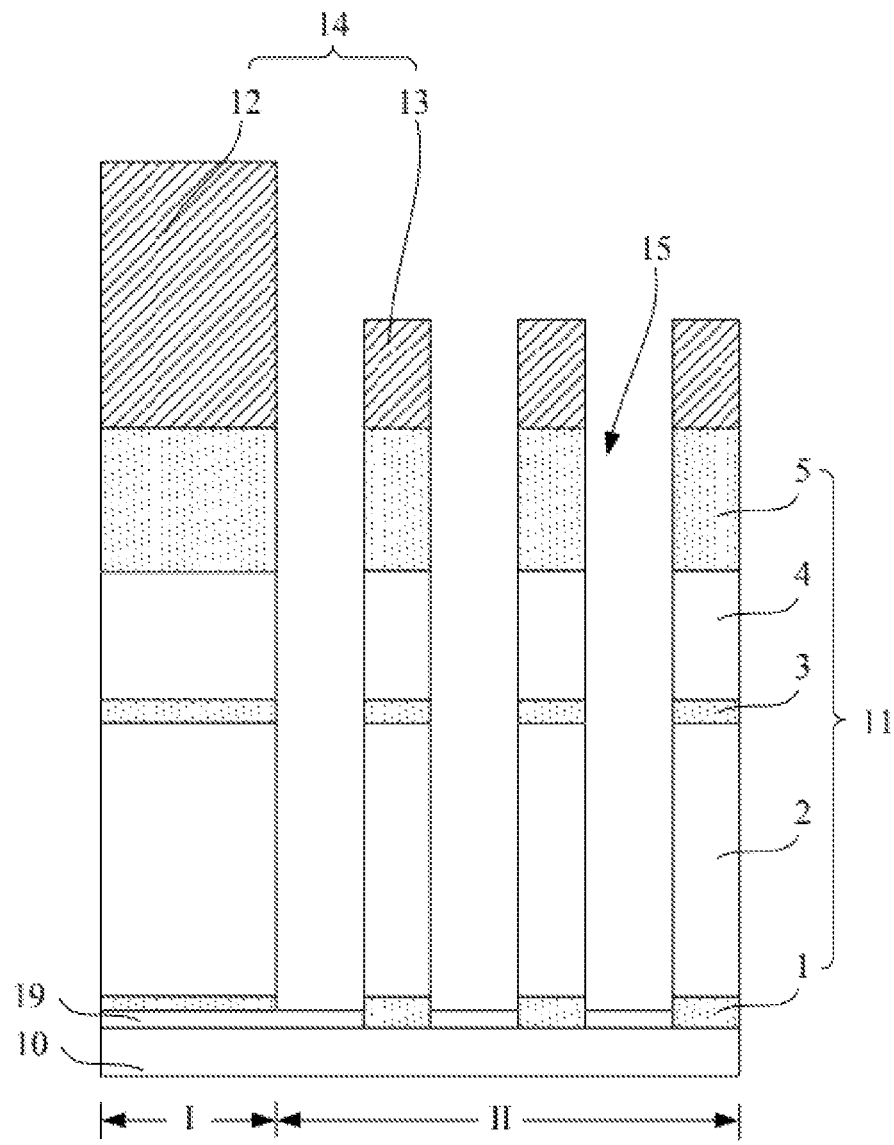

Process steps for forming a contact hole 15 are generally shown in FIGS. 1 to 2.

Referring to FIG. 1, a substrate 10 is provided, and the substrate 10 has a peripheral region I and an array region II. An insulating layer 11 and a mask layer 14 with a mask pattern are sequentially stacked on the substrate 10. At this point, in a direction perpendicular to a surface of the substrate 10, the mask layer 12 located in the peripheral region I and the mask layer 13 located in the array region II have a same thickness. Specifically, the substrate 10 has structures such as a bitline, a wordline, a capacitor contact window, or the like. An electrical connection layer 19 is also provided between the substrate 10 and a part of the insulating layer 11. The electrical connection layer 19 is located between the insulating layer 11 and the peripheral region I. The electrical connection layer 19 is also located between a subsequently formed capacitor lower electrode and the substrate 10 of the array region II. The insulating layer 11 includes a first stabilizing layer 1, a first isolating layer 2, a second stabilizing layer 3, a second isolating layer 4, and a supporting layer 5 that are stacked in sequence.

Further, process steps for forming the mask layer 14 with the mask pattern include: forming an initial mask layer on the insulating layer 11, and performing pattern-dry etching on the initial mask layer to form the mask layer 14 with the mask pattern.

Referring to FIG. 2, when a first etching process is used to etch the insulating layer 11 with the mask layer 14 as a mask to form the contact hole 15, the mask layer 14 is also damaged by the etching. Since a pattern on the mask layer 13 of the array region II with many contact holes 15 has a pattern size much smaller than the pattern on the mask layer 12 of the peripheral region I, that is, a difference in the pattern sizes of the patterns on the mask layers 14 of the peripheral region I and the array region II is provided, the first etching process has a greater etching rate for the mask layer 13 located on the array region II, and has a smaller etching rate for the mask layer 12 located on the peripheral region I. When the contact hole 15 is formed, the mask layer 13 of the array region II has an etched amount more than the mask layer 12 of the peripheral region I, so that the mask layer 12 of the peripheral region I has a thickness greater than the mask layer 13 of the array region II.

Figure 3:
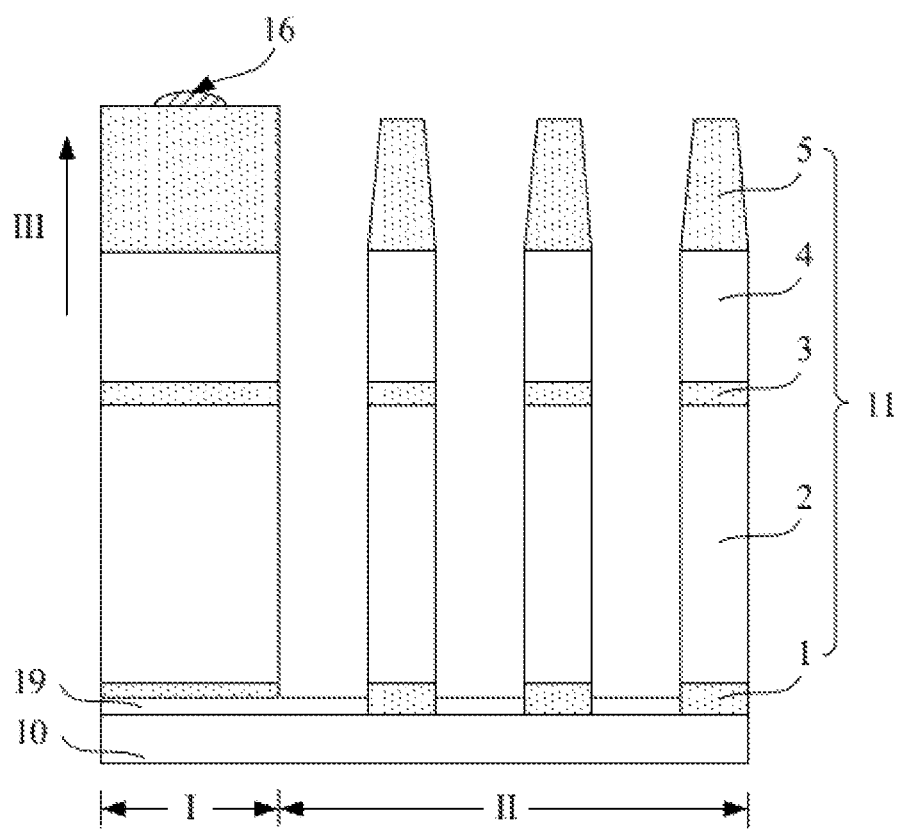
Figure 4:
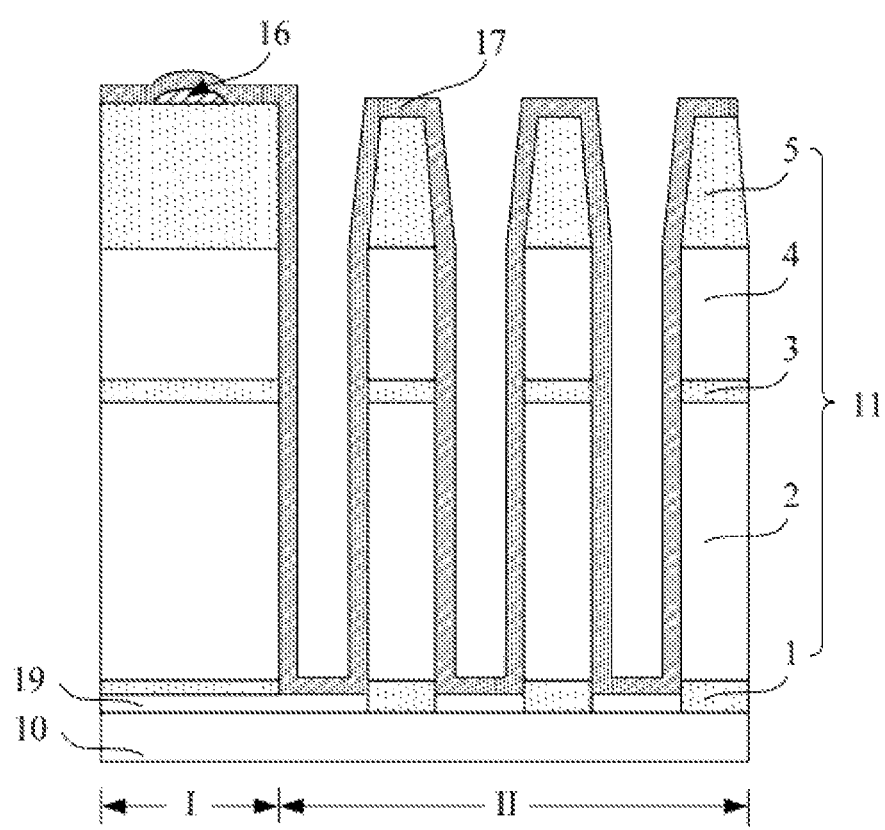
Figure 5:
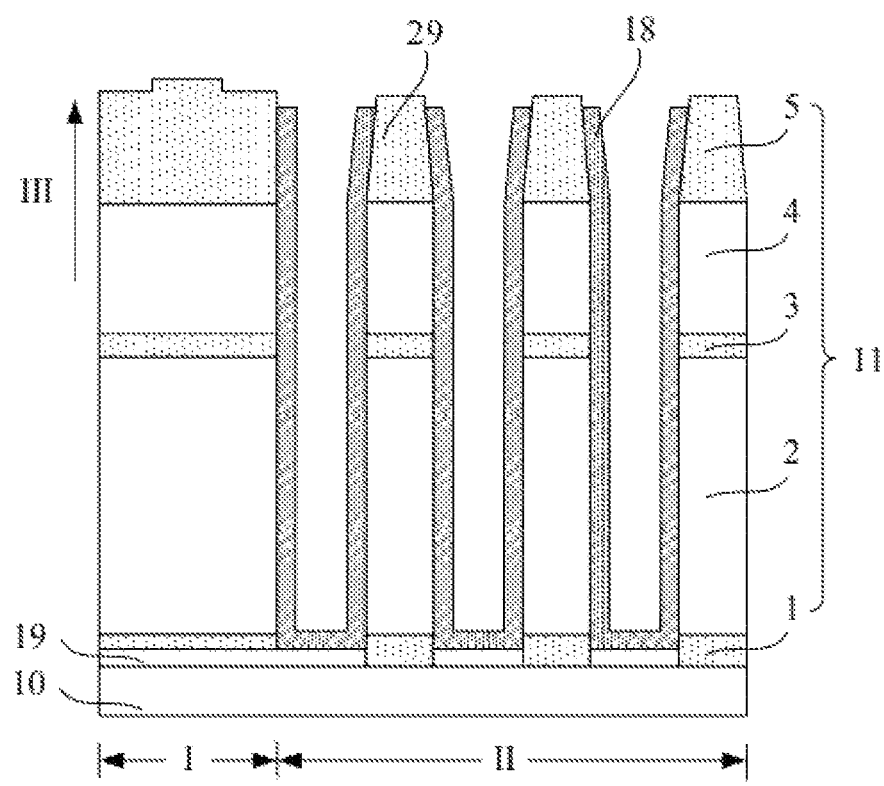
Figure 6:
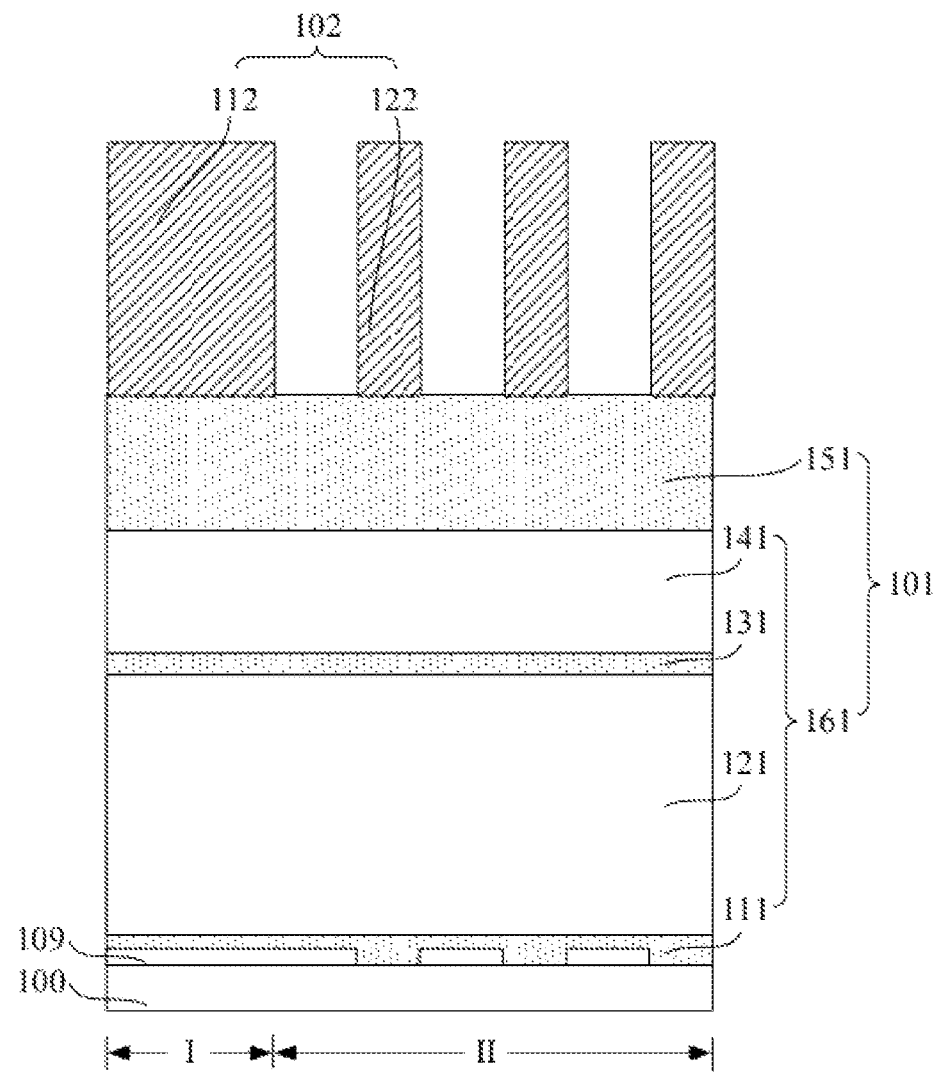
FIGS. 6 to 14 are schematic diagrams of cross-sectional structures corresponding to steps of a method for manufacturing a semiconductor structure according to a first embodiment of the disclosure.

Process steps for forming the capacitor lower electrode are generally shown in FIGS. 3 to 5.

Referring to FIG. 3, the mask layer 14 located on the insulating layer 11 is etched away (referring to FIG. 2).

Since the mask layer 12 of the peripheral region I has a thickness greater than the mask layer 13 of the array region II, in a same etching time, a residue of the mask layer 12 is provided on the insulating layer 11 of the peripheral region I (referring to FIG. 1), thus forming a bump defect 16. A part of the insulating layer 11 located on the array region II is also etched, so that in a direction III where the substrate 10 points to the insulating layer 11, a width of the insulating layer 11 gradually becomes narrower, which is not beneficial to ensuring dimensional accuracy of the insulating layer 11, and thus affects the dimensional accuracy of the subsequently formed capacitor lower electrode.

Referring to FIG. 4, a conformal first material layer 17 for coverage is formed. The first material layer 17 is located at a bottom and a sidewall of the contact hole 15 (referring to FIG. 2), and a surface of the insulating layer 11 is also covered with the first material layer 17. Due to the existence of the bump defect 16, the first material layer 17 located on the peripheral region I is raised at the bump defect 16.

Referring to FIG. 5, when removing the first material layer 17 on a top of the insulating layer 11 to form the capacitor lower electrode, in order to remove the bump defect 16 of the peripheral region I (referring to FIG. 3), a part of the insulating layer 11 of the peripheral region I is removed, so that the remaining insulating layer 11 of the peripheral region I has a bump at a position corresponding to the bump defect 16. When a photolithography process is subsequently used to remove a part of the insulating layer 11 to form structures such as a capacitor dielectric layer, the capacitor lower electrode, or the like, the bump causes a photolithography pattern to be defocused, thereby affecting etching accuracy of the photolithography process.

In addition, the insulating layer 11 located on the array region II includes a plurality of elongated insulating layers 29 separated by the contact holes 15. Since in the direction III where the substrate 10 points to the insulating layer 11, a width of the elongated insulating layer 29 gradually becomes narrower, a distance between the capacitor lower electrodes 18 located on two sidewalls of a same strip-shaped insulating layer 29 gradually decreases in the direction III, which is likely to cause a short-circuit phenomenon between the adjacent capacitor lower electrodes 18. After removing a part of the insulating layer 11, when a gap is formed between the adjacent capacitor lower electrodes 18, since in the direction III where the substrate 10 points to the insulating layer 11, a distance between the capacitor lower electrodes 18 located on the two sidewalls of the same strip-shaped insulating layer 29 gradually decreases, a top opening of the gap has a size smaller than a bottom opening of the gap, which makes it inconvenient to fill the gap with a material subsequently.

In order to solve the forgoing problems, an embodiment of the disclosure provides a method for manufacturing a semiconductor structure. Before removing a mask layer on an insulating layer, a first material layer is formed on a surface of the mask layer and a surface of a contact hole in an array region. A second material layer is then formed on the first material layer. A part of a thickness of the mask layer of the peripheral region is etched with the second material layer as a mask so that the top of the mask layer in the remaining peripheral region is not higher than a top of the first material layer on the mask layer of the array region to reduce a thickness difference between the mask layer in the remaining peripheral region and the mask layer of the array region. Therefore, in a process for subsequently removing the mask layer and part of the first material layer to form a capacitor lower electrode, on the premise of completely removing the mask layer located on the top of the insulating layer, the etching of the insulating layer of the array region can be avoided, and the dimensional accuracy of the insulating layer can be reduced, which causes reduction in dimensional accuracy of the subsequently formed capacitor lower electrode and a short-circuit phenomenon between the adjacent capacitor lower electrodes, hence is beneficial to improving the dimensional accuracy of the capacitor lower electrode to reduce signal interference between the adjacent capacitor lower electrodes, and is beneficial to improving a yield of the semiconductor structure.

In order to make objectives, technical solutions, and advantages of embodiments of the disclosure clearer, various embodiments of the disclosure are described in detail below with reference to drawings. However, those skilled in the art can understand that in each embodiment of the disclosure, many technical details are proposed for a reader to better understand the disclosure.

However, even without these technical details and various changes and modifications based on the following embodiments, the technical solutions claimed in the disclosure can be realized.

FIGS. 6 to 14 are schematic diagrams of cross-sectional structures corresponding to steps of a method for manufacturing a semiconductor structure according to a first embodiment of the disclosure.

Referring to 6, a substrate 100 is provided. The substrate 100 has a peripheral region I and an array region II; an insulating layer 101 and a mask layer 102 with a mask pattern are stacked on the substrate 100. The mask layer 102 located on the peripheral region I is a first mask layer 112. The mask layer 102 located on the array region II is a second mask layer 122. A top of the first mask layer 112 is flush with a top of the second mask layer 122.

In this embodiment, the semiconductor structure can be a memory. The substrate 100 has structures such as a bitline, a wordline, a capacitor contact window, or the like. The peripheral region I is located around the array region II. The peripheral region I is configured to realize electrical connection of input and output circuits of the memory and other electrical elements. The array region II is configured to realize electrical connection between different conductive structures in the memory.

Specifically, process steps for forming the insulating layer 101 include: forming a dielectric layer 161 on the substrate 100; and forming a supporting layer 151 on the dielectric layer 161. A material of the dielectric layer 161 includes silicon oxide or silicon nitride, and a material of the supporting layer 151 can be silicon nitride or silicon carbonitride.

In this embodiment, a process step for forming the dielectric layer 161 includes: sequentially stacking and forming a first stabilizing layer 111, a first isolating layer 121, a second stabilizing layer 131, and a second isolating layer 141 on the substrate 100, which facilitates subsequent formation of a contact hole with a relatively large depth-to-width ratio. In other embodiments, the dielectric layer 161 can also have a single-layer structure.

Specifically, materials of the first stabilizing layer 111 and the second stabilizing layer 131 include silicon nitride or silicon carbonitride. The subsequently formed capacitor lower electrode is located on sidewalls of the second stabilizing layer 131 and the supporting layer 151. The second stabilizing layer 131 and the supporting layer 151 each can support the capacitor lower electrode to avoid tilting or collapse of the capacitor lower electrode. In this embodiment, the materials of the first stabilizing layer 111, the second stabilizing layer 131 and the supporting layer 151 are the same and all are silicon nitride. In other embodiments, the materials of the first stabilizing layer 111, the second stabilizing layer 131, and the supporting layer 151 can be different. In addition, since it is necessary to remove a part of the supporting layer 151 later, to ensure that the supporting layer 151 can reinforce the capacitor lower electrode, the supporting layer 151 can have a thickness greater than the first stabilizing layer 111 and the second stabilizing layer 131.

In subsequent processes for forming structures such as a capacitor upper electrode, a capacitor dielectric layer, or the like, the first isolating layer 121 and the second isolating layer 141 are removed. Therefore, materials that can be easily removed can be configured as materials of the first isolating layer 121 and the second isolating layer 141. The materials of the first isolating layer 121 and the second isolating layer 141 can be silicon oxide. In this embodiment, the materials of the first isolating layer 121 and the second isolating layer 141 are the same. In other embodiments, the materials of the first isolating layer 121 and the second isolating layer 141 can be different.

In this embodiment, the materials of the first isolating layer 121 and the second isolating layer 141 are the same, and both can be silicon oxide. In other embodiments, the materials of the first isolating layer 121 and the second isolating layer 141 can also be different.

In this embodiment, an electrical connection layer 109 is also provided between the substrate 100 and a part of the insulating layer 101. The electrical connection layer 109 is located between the insulating layer 101 and the peripheral region I. The electrical connection layer 109 is also located between a subsequently formed capacitor lower electrode and the substrate 100 of the array region II. A material of the electrical connection layer 109 can be polysilicon or metal.

Figure 7:
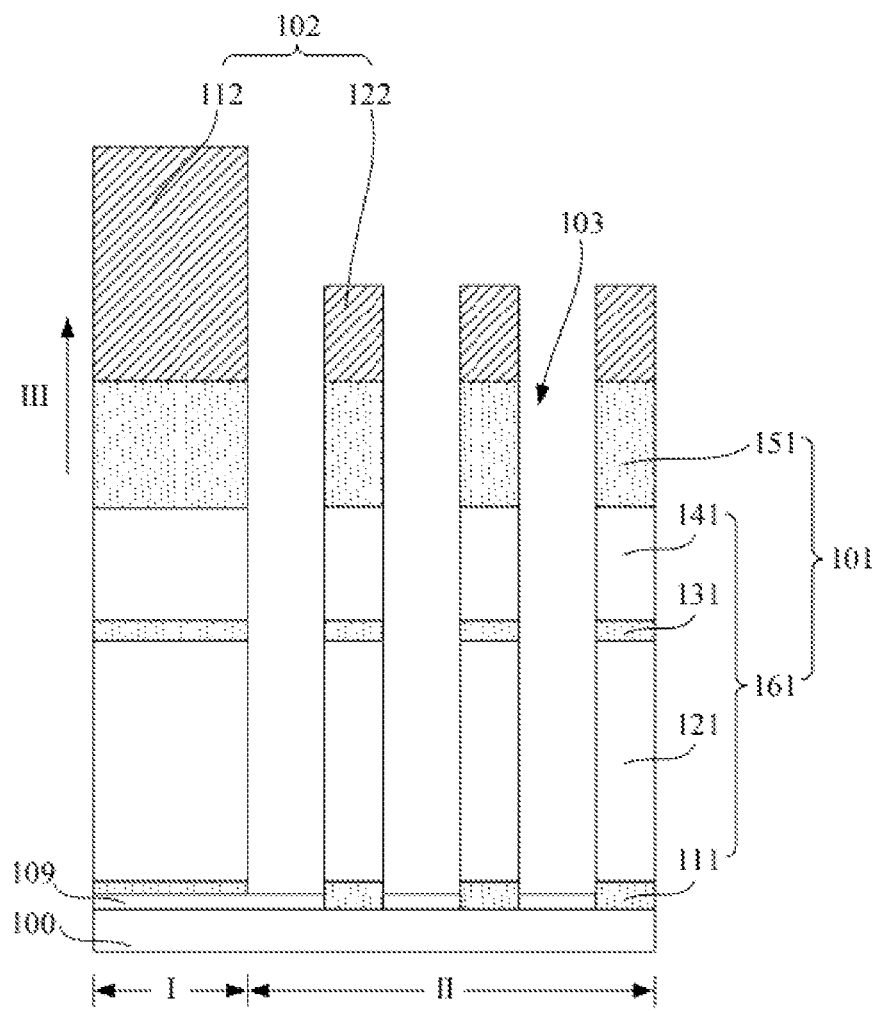

Referring to FIG. 7, the insulating layer 101 is etched with the mask layer 102 as a mask to form the contact hole 103 penetrating the insulating layer 101 at the array region II. After the contact hole 103 is formed, the mask layer 102 is reserved. Since the pattern sizes of the patterns on the first mask layer 112 and the second mask layer 122 are different, in the direction III perpendicular to the surface of the substrate 100, a thickness difference between the first mask layer 112 and the second mask layer 122 is provided. Specifically, a top of the first mask layer 112 is higher than a top of the second mask layer 122.

In this embodiment, a material of the mask layer 102 includes polysilicon. In a direction perpendicular to a surface of the substrate 100, the thickness difference between the first mask layer 112 and the second mask layer 122 can be 100-500 nm. The thickness difference between the first mask layer 112 and the second mask layer 122 is related to a depth-width ratio of the formed contact hole 103. In one example, the thickness difference between the first mask layer 112 and the second mask layer 122 is 300 nm. In other embodiments, the material of the mask layer 102 can also be other materials with a higher etching selection ratio to the insulating layer 101.

Figure 8:
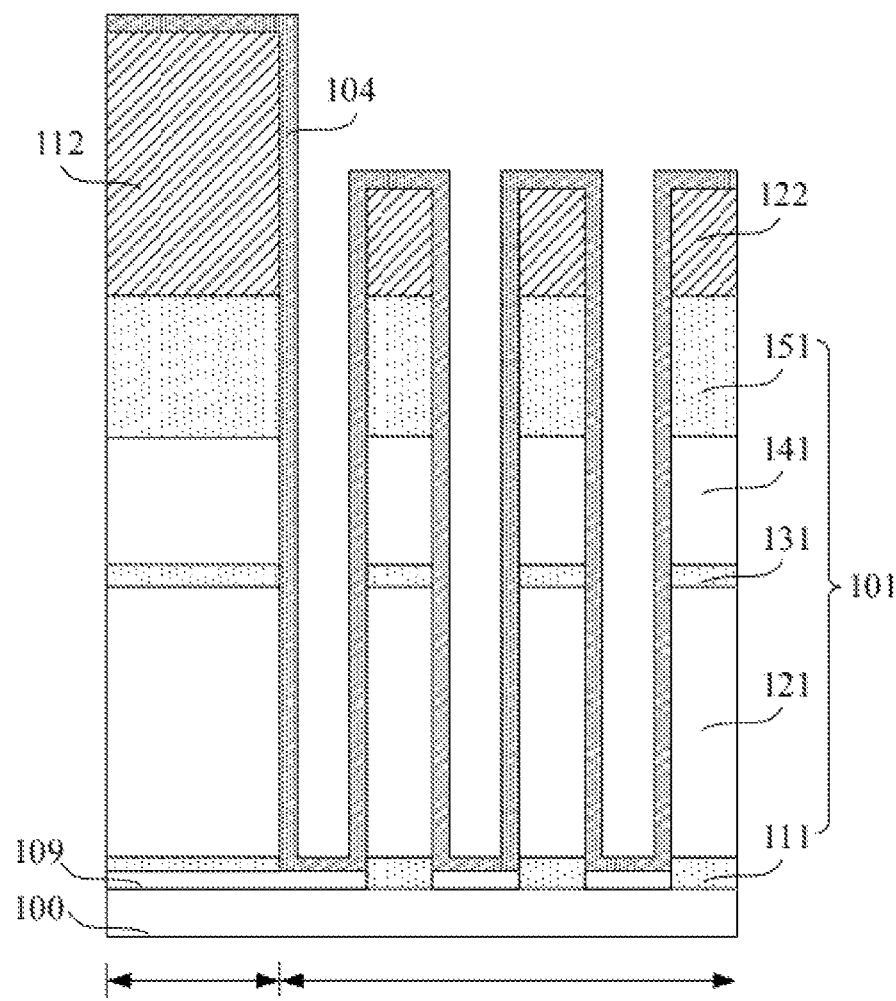

Referring to FIG. 8, a first material layer 104 is formed. The surface of the second mask layer 122 and the surface of the contact hole 103 are at least covered with the first material layer 104 (referring to FIG. 7). When the first mask layer 112 and the second mask layer 122 are subsequently removed, the first material layer 104 higher than a top of the insulating layer 101 is also removed, and the remaining first material layer 104 can be configured as the capacitor lower electrode. Under the premise of ensuring that the first mask layer 112 and the second mask layer 122 are both completely removed and of not damaging the insulating layer 101, it is beneficial to improve the dimensional accuracy of the formed capacitor lower electrode, thereby improving a yield of the semiconductor structure.

In this embodiment, the surface of the first mask layer 112 is also covered with the first material layer 104. In other embodiments, the first material layer 104 can only be located on the surface of the second mask layer 122 and the surface of the contact hole 103.

Specifically, the first material layer 104 can be formed by a deposition process, where the deposition process includes chemical vapor deposition or atomic layer deposition. The first material layer 104 is made of a capacitor electrode material, where the capacitor electrode material includes conductive materials such as titanium nitride, titanium, polysilicon, tungsten, or the like.

In this embodiment, the first material layer 104 is deposited on the surfaces of both the first mask layer 112 and the second mask layer 122 by the deposition process. When the mask layer 102 is subsequently removed, a part of the first material layer 104 is also removed at the same time to form the capacitor lower electrode. It is beneficial to simplifying process steps for preparing the semiconductor structure by simultaneously removing the mask layer 102 and a part of the first material layer 104 while ensuring that the dimensional accuracy of the subsequently formed capacitor lower electrode meets requirements.

Figure 10:
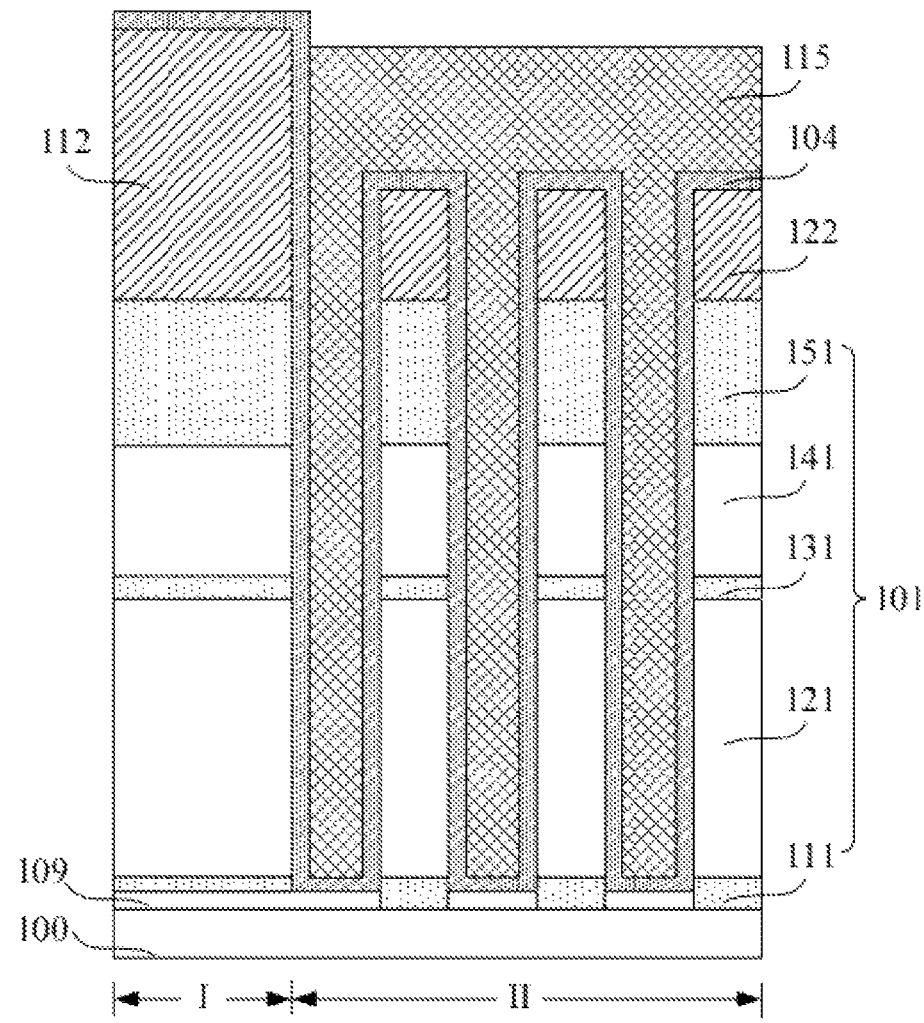

Referring to FIG. 10, a second material layer 115 is formed. The second material layer 115 is located on the first material layer 104 of the array region II. A plurality of through holes is enclosed by the first material layer 104 of the array region II. The plurality of through holes are filled up with the second material layer 115. A top surface of the second material layer 115 is lower than that of the first material layer 104 of the peripheral region I. In other embodiments, the top surface of the second material layer 115 can also be flush with the top surface of the first material layer 104 of the peripheral region I.

Since the surface of the first material layer 104 of the array region II is covered with the second material layer 115 and the plurality of through holes enclosed by the first material layer 104 are filled up with the second material layer 115, when the first mask layer 112 and the first material layer 104 of the peripheral region I are subsequently etched with the second material layer 115 as the mask, the second material layer 115 can provide a good protection for the first material layer 104 of the array region II to ensure the dimensional accuracy of the subsequently formed capacitor lower electrode.

Figure 9:
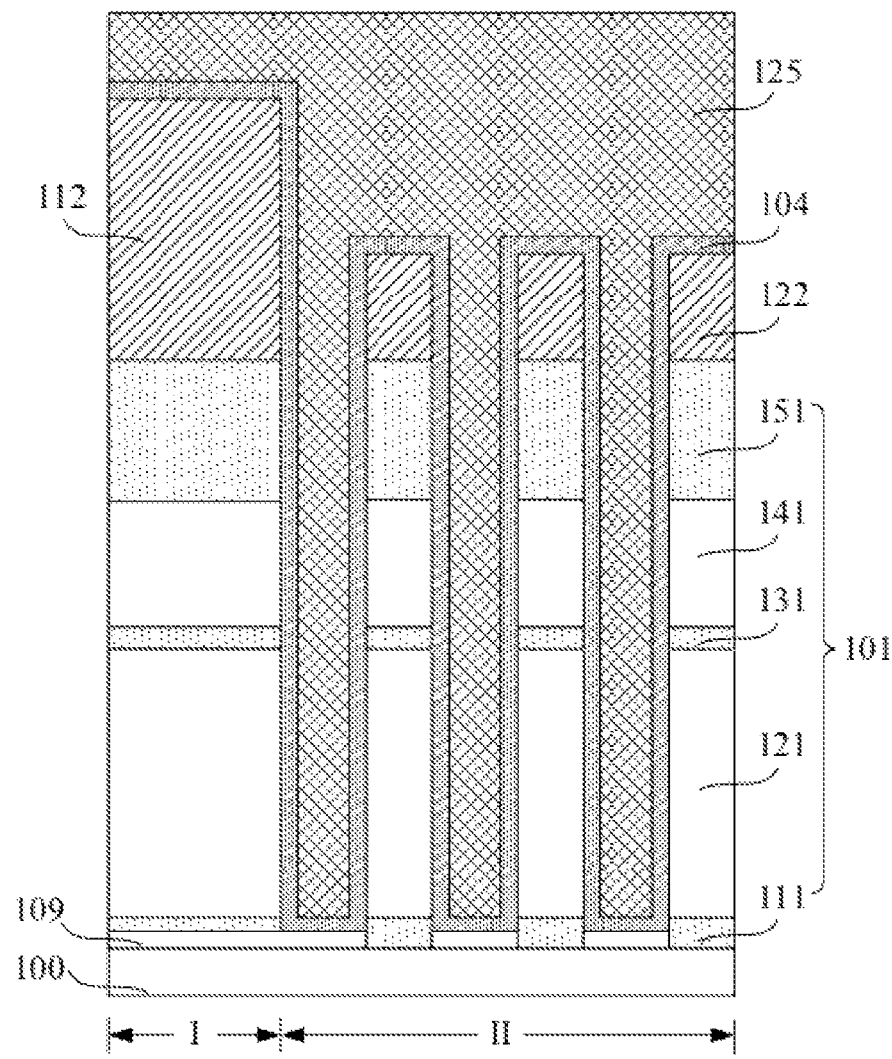

In this embodiment, process steps for forming the second material layer 115 include: referring to FIG. 9, forming an initial second material layer 125, where the surface of the first material layer 104 is covered with the initial second material layer 125, and a top surface of the initial second material layer 125 is higher than the highest surface of the first material layer 104; and referring to FIG. 10, removing a part of the initial second material layer 125 to expose the highest surface of the first material layer 104 to form the second material layer 115.

In this embodiment, the second material layer 115 is configured as a flowable medium. Since the flowable medium has good fluidity and a filling property, it is beneficial for the second material layer 115 to cover the surface of the first material layer 104 uniformly and without a gap and to fill up the contact hole 103. When the mask layer 102 and a part of the first material layer 104 are subsequently removed to form the capacitor lower electrode, the second material layer 115 filling up the contact hole 103 can protect the substrate 100 at a bottom of the contact hole 103, so that the substrate 100 is not in contact with a residue generated when the mask layer 102 and a part of the first material layer 104 are removed, thereby improving the yield of the semiconductor structure.

Further, the flowable medium includes a photoresist or a dielectric medium including a Si—H bond, a Si—N bond, and a N—H bond. A method for forming the second material layer 115 includes a chemical vapor deposition process or a spin coating process.

Specifically, the second material layer 115 is configured as the photoresist for illustration. Referring to FIG. 9, the method for forming the initial second material layer 125 is as follows: coating a photoresist layer on the first material layer 104 with the spin coating process, where a top of the photoresist layer is higher than the highest surface of the first material layer 104. Since an overall size of the semiconductor structure is relatively small in a process for preparing the semiconductor structure, when the surfaces of the first material layer 104 of the peripheral region I and the first material layer 104 of the array region II are coated with the photoresist layer, the peripheral region I does not need to be distinguished from the array region II. In addition, because the process is easier to operate, it is beneficial to simplifying process steps of preparing the semiconductor structure.

In other embodiments, referring to FIG. 10, the second material layer 115 can also be formed only on the surface of the first material layer 104 of the array region II. Specifically, a photoresist layer can be coated only on the first material layer 104 of the array region II, and a top of the photoresist layer is lower than that of the first material layer 104 of the array region II.

In other embodiments, when the first material layer 104 is not formed on the surface of the first mask layer 112, the process steps for forming the second material layer 115 can include: forming the initial second material layer 125 on the surfaces of the first mask layer 112 and the first material layer 104; and removing a part of the initial second material layer 125 to expose the first mask layer 112, where the remaining initial second material layer 125 is the second material layer 115.

In this embodiment, a method of removing a part of the initial second material layer 125 to expose the highest surface of the first material layer 104 is etching. Specifically, a part of the initial second material layer 125 can be etched with a dry etching process until the highest surface of the first material layer 104 is exposed. An etching gas includes oxygen, nitrogen, or hydrogen.

In one embodiment, the highest surface of the first material layer 104 is configured as an etching stop layer, and a part of the initial second material layer 125 is removed with an oxygen-containing plasma. Since a material of the initial second material layer 125 is the photoresist, and the oxygen-containing plasma can quickly react with the photoresist to generate carbon dioxide, carbon monoxide, and water, the oxygen-containing plasma reacts quickly with the initial second material layer 125 so that a part of the initial second material layer 125 can be removed relatively quickly, which improves efficiency of preparing the semiconductor structure.

In other embodiments, a method of removing a part of the initial second material layer 125 to expose the highest surface of the first material layer 104 can also be chemical mechanical polishing.

Figure 11:
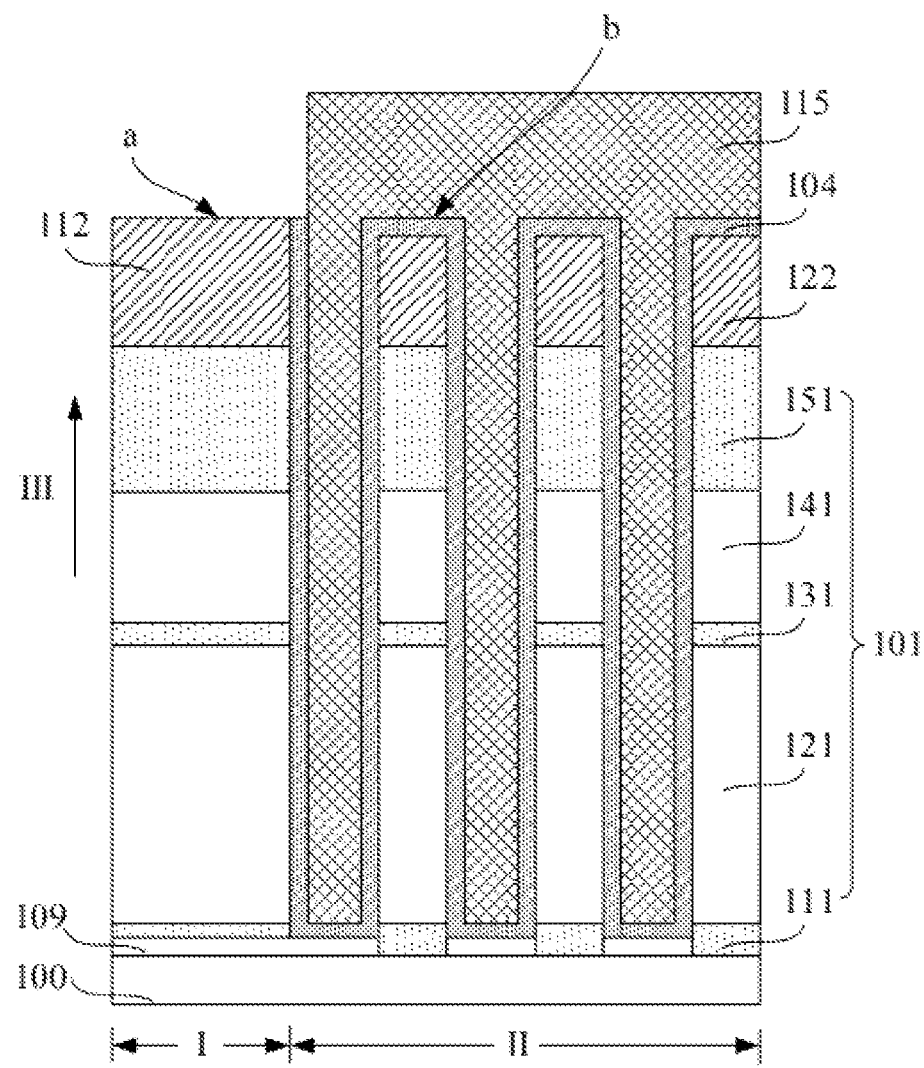

Referring to FIG. 11, a part of the first mask layer 112 is etched with the second material layer 115 as the mask to reduce the thickness difference between the first mask layer 112 and the second mask layer 122. Specifically, a top of the remaining first mask layer 112 is not higher than a top b of the first material layer 104 on the second mask layer 122.

In this embodiment, since the top and a sidewall of the first mask layer 112 are also formed with the first material layer 104, a process step for etching a part of a thickness of the first mask layer 112 with the second material layer 115 as the mask also includes: etching the first material layer 104 on the first mask layer 112.

In this embodiment, a method for etching a part of the first mask layer 112 and the first material layer 104 on the first mask layer 112 is the dry etching process. In one example, the material of the first mask layer 112 is polysilicon, and the material of the first material layer 104 is titanium nitride or titanium. The same dry etching process has a relatively small difference between etching rates for polysilicon and titanium nitride or titanium, and the first mask layer 112 is not damaged, so a part of the first mask layer 112 and a part of the first material layer 104 can be removed at the same time via the same etching process, which is beneficial to simplifying the process steps of preparing the semiconductor structure. Specifically, a part of the first mask layer 112 and a part of the first material layer 104 can be etched with a chlorine-containing and/or fluorine-containing plasma. Since the material of the first mask layer 112 is polysilicon, and the material of the first material layer 104 is titanium nitride or titanium, both the first mask layer 112 and the first material layer 104 easily react with the chlorine-containing and/or fluorine-containing plasmas, which can quickly remove a part of the first mask layer 112 and a part of the first material layer 104, and is beneficial to improving preparing efficiency of the semiconductor structure. In other embodiments, a method for etching the first mask layer 112 and the first material layer 104 on the first mask layer 112 can also be a wet etching process.

In other embodiments, the first material layer 104 on the first mask layer 112 is first etched away with the second material layer 115 as the mask, and then a part of the thickness of the first mask layer 112 is etched with the second material layer 115 and the remaining first material layer 104 as the mask so that a top of the remaining first mask layer 112 is not higher than that of the first material layer 104 on the second mask layer 122.

In this embodiment, the top a of the remaining first mask layer 112 is not higher than the top b of the first material layer 104 on the second mask layer 122. In one example, the top of the remaining first mask layer 112 is flush with the top of the second mask layer 122, which is beneficial to eliminating a thickness difference between the remaining first mask layer 112 and the second mask layer 122. Therefore, in a subsequent process step for removing the mask layer 102 and a part of the first material layer 104, the first mask layer 112, the second mask layer 122, and the first material layer 104 higher than the top of the insulating layer 101 can be simultaneously and completely removed, thereby avoiding a part of the first mask layer 112 from remaining on the insulating layer 101 of the peripheral region I, avoiding a part of the insulating layer 101 located on the array region II from being removed, avoiding the width of the insulating layer 101 from being gradually decreased in the direction III where the substrate 10 points to the insulating layer 101, being beneficial to ensuring dimensional accuracy of the insulating layer 101, being beneficial to ensuring the dimensional accuracy of the capacitor lower electrode located on a sidewall of the insulating layer 101, avoiding a distance between the adjacent capacitor lower electrodes from being smaller, reducing a probability of a short circuit between the adjacent capacitor lower electrodes, reducing a signal interference between the lower electrodes of adjacent capacitors, and improving the yield of the semiconductor structure.

It should be noted that the first material layer 104 has a thin layer structure, so in a subsequent process step for removing the first mask layer 112, the second mask layer 122, and the first material layer 104 higher than the top of the insulating layer 101, the first material layer 104 has little effect on etching time. It can be considered that when the first mask layer 112 and the second mask layer 122 are completely removed in the same etching time, the first material layer 104 higher than the top of the insulating layer 101 is also completely removed.

In addition, since the dimensional accuracy of the subsequently formed capacitor lower electrode is improved, when the first isolating layer 121 and the second isolating layer 141 are subsequently removed to form the capacitor dielectric layer and the capacitor upper electrode, or the like, the capacitor upper electrode and the capacitor dielectric layer are molded according to the capacitor lower electrode with higher dimensional accuracy, thereby being beneficial to improving the dimensional accuracy of the formed capacitor upper electrode and the capacitor dielectric layer.

Figure 14:
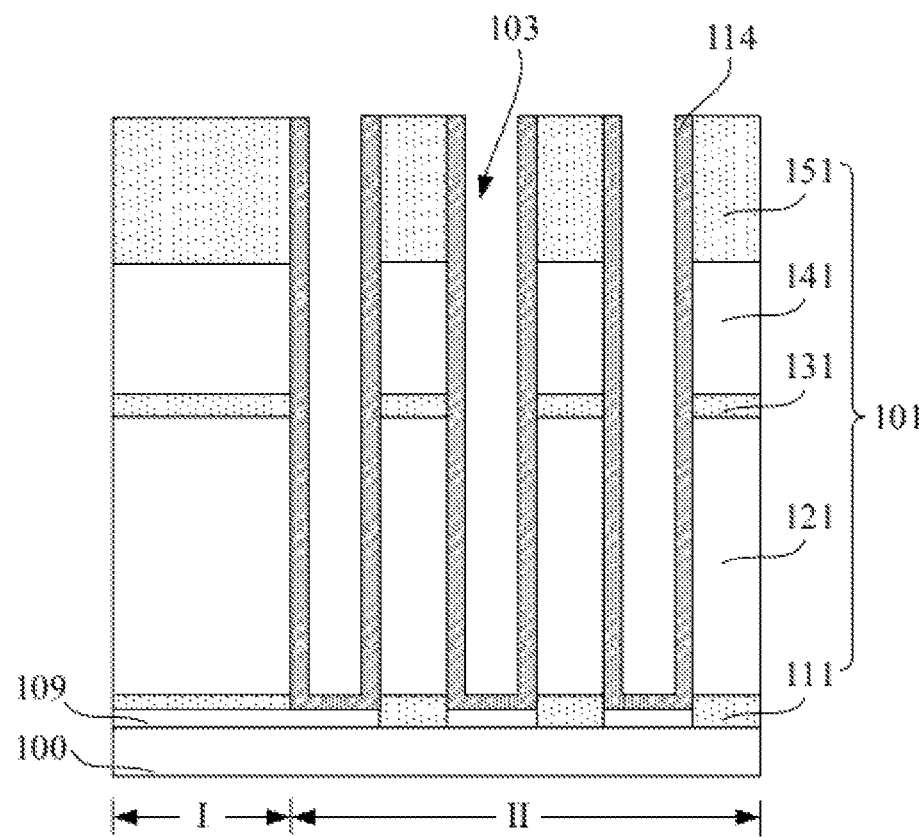

Referring to FIGS. 11 and 14, the remaining second material layer 115, the remaining mask layer 102, and the first material layer 104 on the remaining mask layer 102 are removed to form the capacitor lower electrode 114.

Figure 12:
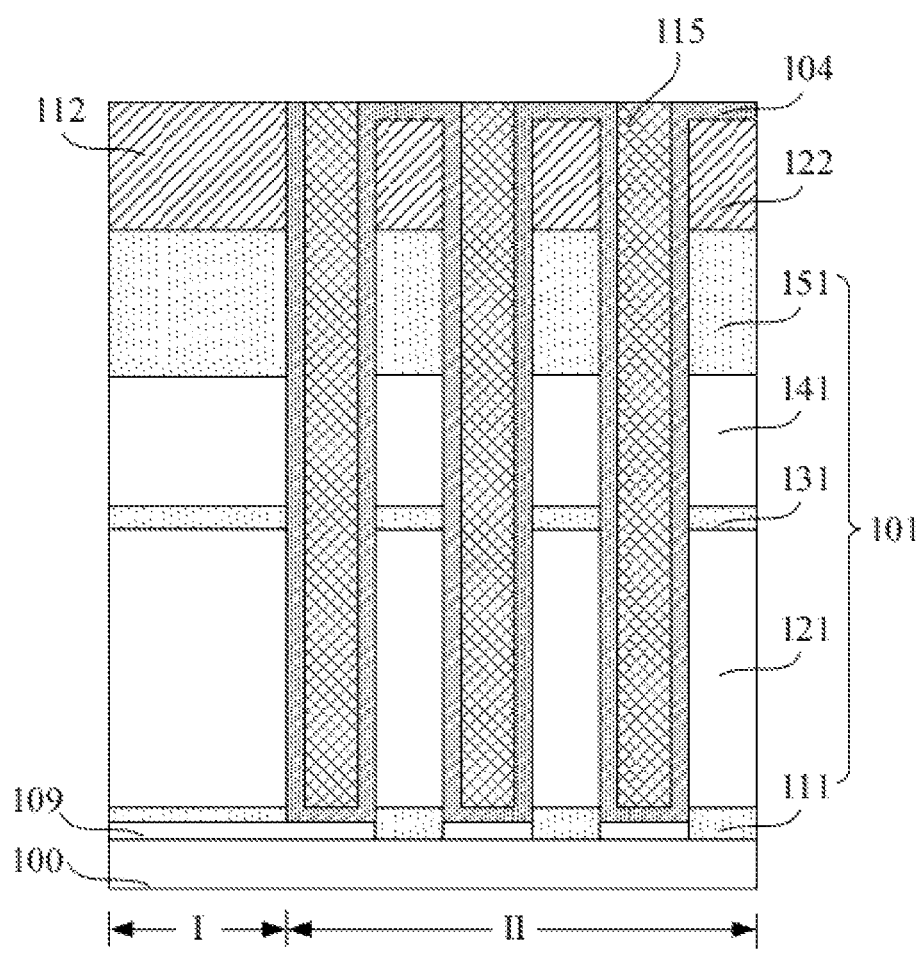

Specifically, a process step for forming the capacitor lower electrode 114 includes:

referring to FIG. 12, etching a part of the remaining second material layer 115 to expose the first material layer 104 on the top of the second mask layer 122. In this embodiment, a process for etching the part of the second material layer 115 is the same as the process for etching the part of the initial second material layer 125. The first material layer 104 on the top of the second mask layer 122 is the etching stop layer. A part of the remaining second material layer 115 is removed with the oxygen-containing plasma.

It should be noted that an objective of reserving the second material layer 115 in the contact hole 103 (referring to FIG. 7) is to facilitate subsequent use of the reserved second material layer 115 as a mask to remove the unmasked first mask layer 112 of the reserved second material layer 115, the second mask layer 122, and a part of the first material layer 104.

Figure 13:
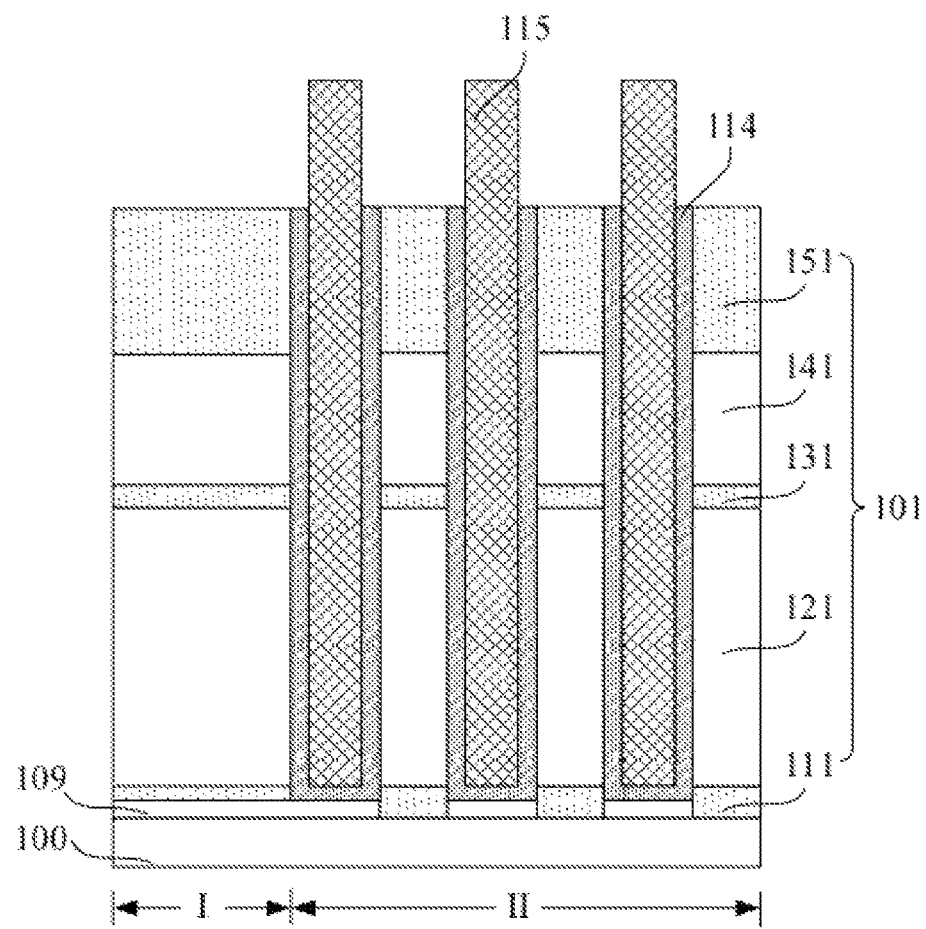

Referring to FIG. 13, with the remaining second material layer 115 as the mask, the second mask layer 122 on the remaining first mask layer 112, the first material layer 104 on the remaining first mask layer 112, and the first material layer 104 on the second mask layer 122 are removed to form the capacitor lower electrode 114. In this embodiment, the remaining first mask layer 112, the second mask layer 122, and a part of the first material layer 104 can also be removed with the dry etching process.

Referring to FIG. 14, the remaining second material layer 115 is removed. In this embodiment, the remaining second material layer 115 is removed with a third etching process, and the third etching process is the same as the foregoing process for etching a part of the initial second material layer 125.

In this embodiment, before removing the mask layer 102 on the insulating layer 101 (referring to FIG. 7), the first material layer 104 is formed at least on a surface of the mask layer 102 and the surface of the contact hole 103 of the array region II and is subsequently configured as the capacitor lower electrode 114 in the semiconductor structure. The second material layer 115 is then formed on the first material layer 104. A part of a thickness of the mask layer 102 is etched with the second material layer 115 as the mask to reduce the thickness difference between the mask layer 102 of the peripheral region I and the mask layer 102 of the array region II, thereby being beneficial to forming the semiconductor structure as shown in FIG. 14.

Referring to FIG. 14, since the top of the insulating layer 101 of the peripheral region I is flush with the top of the insulating layer 101 of the array region II, and the top of the capacitor lower electrode 114 on the sidewall of the contact hole 103 is flush with the top of the insulating layer 101, when other structures are formed on the top of the capacitor lower electrode 114 and the top of the insulating layer 101 by using subsequently photolithography, defocusing of the photolithography pattern resulted from unevenness of the top of the insulating layer 101 itself or a height difference between the top of the insulating layer 101 and the top of the capacitor lower electrode 114 is avoided, which is beneficial to improving the etching accuracy of a subsequent photolithography process and the dimensional accuracy of other structures formed subsequently, thereby being beneficial to improving the yield of the semiconductor structure.

In addition, the capacitor lower electrodes 114 on the sidewalls of the adjacent through holes 103 are parallel to each other, so a distance between the adjacent capacitor lower electrodes 114 is constant, thereby being beneficial to reducing a probability of the short circuit between the adjacent capacitor lower electrodes 114. A part of the insulating layer 101 is subsequently removed. When a gap is formed between the adjacent capacitor lower electrodes 114, a size of a top opening of the gap and a size of a bottom opening of the gap can be kept the same, which facilitates subsequent filling of the gap with a material.

Those skilled in the art can understand that the forgoing embodiments are specific examples for realizing the disclosure. In actual disclosures, various changes can be made in a form and details without departing from the spirit and scope of the disclosure. Those skilled in the art can make changes and modifications without departing from the spirit and scope of the disclosure. Therefore, the protection scope of the disclosure shall be subject to the scope defined by the claims.

What is claimed is:

1. A method for manufacturing a semiconductor structure, comprising:
   providing a substrate, wherein the substrate has a peripheral region and an array region;
   stacking and forming an insulating layer and a mask layer with a mask pattern on the substrate;
   etching the insulating layer with the mask layer as a mask to form a contact hole penetrating the insulating layer at the array region; after the contact hole is formed, reserving the mask layer; and in a direction perpendicular to a surface of the substrate, providing a thickness difference between the mask layer of the peripheral region and the mask layer of the array region;

forming a first material layer, wherein a surface of the mask layer and a surface of the contact hole of the array region are at least covered with the first material layer;

forming a second material layer, wherein the second material layer is located on the first material layer;

etching a part of the mask layer with the second material layer as the mask to reduce the thickness difference between the mask layer of the peripheral region and the mask layer of the array region; and removing the remaining second material layer, the remaining mask layer, and the remaining first material layer on the mask layer.

2. The method for manufacturing the semiconductor structure according to claim 1, wherein the surface of the mask layer of the peripheral region is also covered with the first material layer; a process step for etching a part of the mask layer with the second material layer as the mask further comprises: etching the first material layer on the mask layer located at the peripheral region.

3. The method for manufacturing the semiconductor structure according to claim 2, wherein a process step for forming the second material layer comprises:

forming an initial second material layer, wherein a surface of the first material layer is covered with the initial second material layer, and a top surface of the initial second material layer is higher than the highest surface of the first material layer; and removing a part of the initial second material layer to expose the highest surface of the first material layer to form the second material layer.

4. The method for manufacturing the semiconductor structure according to claim 2, wherein the first material layer of the array region is only covered with the second material layer.

5. The method for manufacturing the semiconductor structure according to claim 3, wherein the second material layer is a flowable medium.

6. The method for manufacturing the semiconductor structure according to claim 4, wherein the second material layer is a flowable medium.

7. The method of manufacturing the semiconductor structure according to claim 5, wherein the flowable medium comprises a photoresist or a dielectric medium containing a Si—H bond, a Si—N bond, and an N—H bond.

8. The method of manufacturing the semiconductor structure according to claim 7, wherein the method for forming the second material layer comprises a chemical vapor deposition process or a spin coating process.

9. The method of manufacturing the semiconductor structure according to claim 1, wherein the material of the mask layer comprises polysilicon.

10. The method of manufacturing the semiconductor structure according to claim 1, wherein the first material layer is made of a capacitor electrode material.

11. The method of manufacturing the semiconductor structure according to claim 1, wherein process steps for removing the remaining second material layer, the remaining mask layer, and the remaining first material layer on the mask layer comprises:

etching a part of the remaining second material layer to expose the first material layer on the remaining mask layer; and removing the remaining mask layer and the first material layer on the remaining mask layer with the remaining second material layer as the mask; and removing the remaining second material layer.

12. The method for manufacturing the semiconductor structure according to claim 1, wherein a method for removing a part of the second material layer to expose a highest surface of the first material layer comprises etching or chemical mechanical polishing.

13. The method of manufacturing the semiconductor structure according to claim 1, wherein process steps for forming the insulating layer comprises: forming a dielectric layer on the substrate, and forming a supporting layer on the dielectric layer.

14. The method for manufacturing the semiconductor structure according to claim 13, wherein a process step for forming the dielectric layer comprises: sequentially stacking and forming a first stabilizing layer, a first isolating layer, a second stabilizing layer, and a second isolating layer on the substrate.

* * * * *